United States Patent [19]
McClintock

[11] Patent Number: 5,612,642
[45] Date of Patent: Mar. 18, 1997

[54] POWER-ON RESET CIRCUIT WITH HYSTERESIS

[75] Inventor: Cameron McClintock, Mountain View, Calif.

[73] Assignee: Altera Corporation, San Jose, Calif.

[21] Appl. No.: 430,923

[22] Filed: Apr. 28, 1995

[51] Int. Cl.$^6$ ....................................................... H03L 7/00
[52] U.S. Cl. ........................... 327/143; 327/198; 327/205; 327/206
[58] Field of Search .................................. 327/142, 143, 327/205, 198, 206

[56] References Cited

U.S. PATENT DOCUMENTS

| | | | |
|---|---|---|---|
| 5,136,181 | 8/1992 | Yukawa | 307/296.1 |
| 5,243,233 | 9/1993 | Cliff | 327/143 |
| 5,319,255 | 6/1994 | Garverick et al. | 327/143 |

FOREIGN PATENT DOCUMENTS

| | | | |
|---|---|---|---|
| 4-74015 | 8/1992 | Japan | 327/143 |
| 4-129416 | 8/1992 | Japan | 327/143 |

OTHER PUBLICATIONS

Piasecki, United States Statutory Invention Registration, registration. No. H497, Jul. 1988.

Primary Examiner—Timothy P. Callahan
Assistant Examiner—Jung Ho Kim
Attorney, Agent, or Firm—Townsend and Townsend and Crew, LLP

[57] ABSTRACT

A power-on reset (POR) circuit that initially asserts the POR signal when the supply voltage is turned on. As the supply voltage increases the POR signal is deasserted when it is determined that the supply voltage is sufficiently high to make storage elements in a circuit being controlled by the POR signal fully operational. The POR signal is kept deasserted until the power supply voltage level drops to a level low enough to render the storage elements in the controlled circuit incapable of holding accurate data. The POR signal is then reasserted at this low power supply voltage level. The low power supply voltage level that triggers the reassertion of the POR signal is lower than the sufficiently high power supply voltage level that triggers the deassertion of the POR signal, thus allowing the power supply voltage level to drop significantly before the POR signal is reasserted. A control signal allows the POR signal to be generated in response to different power supply voltage levels. Another control signal allows the POR signal to be forcibly generated.

9 Claims, 4 Drawing Sheets

POWER-ON RESET CIRCUIT WITH HYSTERESIS

BACKGROUND OF THE INVENTION

This invention relates generally to power-on reset circuits and specifically to a power-on reset circuit that is asserted at different voltage levels depending on whether or not the circuit has already become operational.

Power-on reset circuits are commonplace in digital circuit designs. The power-on reset (POR) signal, or merely reset signal, is useful to place the circuit being controlled by the POR signal into a known state after power has first been applied to the circuit. This is especially useful in circuits that use storage elements since the state of a storage element is undefined shortly after power is turned on thus placing the circuit in an unknown and potentially dangerous state.

An example of a power-on reset circuit is U.S. Pat. No. 5,243,233 by Cliff. Cliff discloses a power-on reset circuit where storage elements such as SRAM cells are formed in an integrated circuit. In order to insure that the reset signal is asserted until the SRAM cells become operational, Cliff uses a representative SRAM cell in the generation of the reset signal. The SRAM cell used in the generation of the power-on reset signal is representative of other SRAM cells fabricated on the same silicon substrate forming the integrated circuit. In other words, the SRAM cell and the power-on reset circuit have the same process characteristics as the rest of the cells in the integrated circuit.

The use of identical process storage elements in the POR circuit allows the Cliff POR circuit to deassert the reset signal just after the SRAM cells in a circuit being controlled by, or receiving, the POR signal are known to be operational. This, in turn, reduces the necessary safety margin incorporated in the generation of a reset signal to ensure that storage elements are fully operational before deasserting the reset signal. By reducing the safety margin the reset signal is deasserted earlier in time and the controlled circuit may begin operation earlier than with other forms of reset signal circuits.

However, a problem exists with power-on reset circuits such as Cliff and the prior art in that once the circuit has become operational, a slight decrease in the power supply voltage level may cause the power-on reset circuitry to again assert the reset signal even though such assertion may not be necessary. For a digital system, the assertion of the reset signal when it is not absolutely necessary, results in an interruption of the performance of the digital circuit and, depending the application, could be a very undesirable event.

Thus, it is desirable to have a power-on reset circuit that prevents the reassertion of the reset signal unless it is absolutely necessary.

SUMMARY OF THE INVENTION

Accordingly, the present invention provides a power-on reset circuit with hysteresis. That is, the power-on reset circuit generates a reset signal that is asserted when the power supply voltage is increased above zero volts. The reset signal remains asserted until it is determined that the power supply voltage is at a high enough level to make the integrated circuit operational. In a preferred embodiment, the integrated circuit is deemed to be operational when the supply voltage is sufficiently high to support initial inputing, holding, and outputing of data to and from the storage elements in the integrated circuit.

After the supply voltage is determined to be at a level to render the integrated circuit operational (plus a nominal safety margin), the reset signal is deasserted. The reset signal is kept deasserted until it is determined that the power supply voltage has fallen below the minimum supply voltage required to keep the circuit operational. The voltage needed to maintain circuit operation is less than that needed initially to make the circuit operational. In a preferred embodiment, the circuit is operational, after initial power up, when the storage elements can still retain their data and the data can be read. Thus, even though the power supply level may be below that needed to write to the storage elements, in circuits where the retention and reading of data in storage elements is sufficient for operation (for example, a circuit where storage elements are written only at power up), it is desirable to prevent a reset from occurring until it is known that data has been lost or is otherwise unreadable.

The present invention uses a circuit that incorporates multiple storage elements where the state of the storage elements is determined by the power supply voltage level.

One embodiment of the invention includes a circuit for outputing a reset signal in response to a power supply voltage. The circuit includes an output terminal for outputing the reset signal; means coupled to the output terminal and the power supply voltage for asserting the reset signal when the power supply voltage is turned on; means coupled to the output terminal and the power supply voltage for deasserting the reset signal when the power supply voltage attains the first voltage; and means coupled to the output terminal and the power supply voltage for reasserting the reset signal when, subsequent to the power supply voltage obtaining the first voltage, the power supply voltage obtains a second voltage below the first voltage.

Another embodiment of the invention includes a circuit for outputing a reset signal in response to a power supply voltage. The circuit includes an output terminal for outputing the reset signals; a memory cell operable at a write voltage for inputing, holding and outputing an electrical state and further operable at a read voltage for holding and outputing an electrical state; a reference signal used as an input to the memory cell for putting the memory cell in a first electrical state when the power supply voltage is at least the write voltage; a pass gate for decoupling the reference signal from the memory cell after the memory cell has been placed in the first electrical state; and a leakage input signal coupled to the input of the memory cell for placing the memory cell in a second electrical state when the power supply voltage is below the read voltage.

DESCRIPTION OF THE PREFERRED EMBODIMENT

Figure 1:
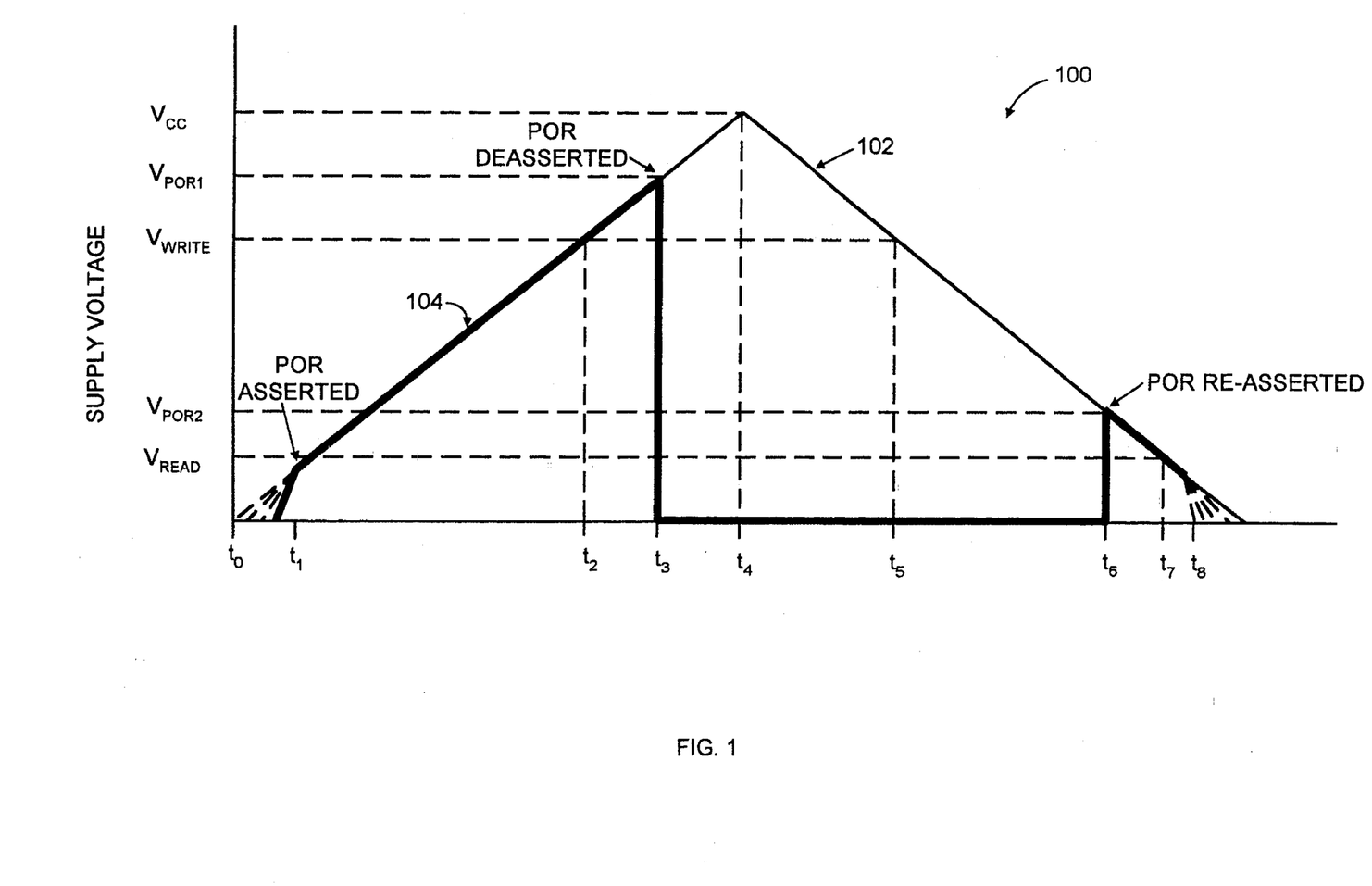
FIG. 1 is a timing diagram showing a power supply voltage waveform ad a power-on reset signal.

FIG. 1 is a timing diagram 100 showing a power supply voltage waveform 102 as a thin line and a power-on reset (POR) signal 104 as a thick line. POR signal 104 is generated according to the present invention by a circuit discussed below. The POR signal is typically applied to an external circuit, or "controlled" circuit and is distributed to storage elements and other components of the controlled circuit to reset the controlled circuit by holding the components in a predetermined state until the POR signal is deasserted. When the POR signal is deasserted the controlled circuit begins its normal operation and continues its normal operation until the POR signal is again asserted, or reasserted. In a preferred embodiment, the POR circuit and the controlled circuit are formed in an integrated circuit on a common substrate.

In FIG. 1, at $t_0$, after the power supply is turned on, the power supply voltage waveform 102 "ramps up" or steadily increases up to its normal operating voltage $V_{cc}$. Typical values for $V_{cc}$ are 3.3 or 5.0 Volts. For purposes of illustration, the timing diagram of FIG. 1 shows power supply voltage waveform 102 decreasing after reading the normal operating voltage so that the Hysteresis effect of the POR reset signal and the present invention can be discussed.

After turning the power supply on at time $t_0$, but before time $t_1$, the state of the POR circuit is undefined so that the voltage, or signal output, of the POR circuit can be in a range of voltages as shown by the dotted lines between $t_0$ and $t_1$. As the power supply voltage increases it reaches a voltage at $t_1$ that is high enough for the POR circuit to come to a defined state and assert the POR signal. This voltage, where the POR signal is first asserted, is about 0.7 Volts. As the power supply voltage ramps up the POR signal shown by the thick line 104 closely tracks the power supply voltage waveform 102.

At time $t_2$, the power supply voltage has risen high enough so that storage, or memory, elements in the integrated circuit may be reliably written with data. This voltage is shown as $V_{write}$ on the timing diagram of FIG. 1 and occurs at time $t_2$. The approximate voltage for $V_{write}$ is 2.3 Volts.

The POR signal is maintained asserted up until time $t_3$ where $V_{cc}$ has reached approximately 2.7 Volts. This provides a safety margin of approximately 0.4 Volts above the 2.3 Volts required to write data into memory elements. Naturally, this safety margin can be increased or decreased as desired to allow an earlier operation of the circuit receiving the POR signal.

At time $t_3$, the power supply voltage level has reached the POR deassertion level $V_{POR1}$, the power supply voltage level equals about 2.7 Volts and the POR reset signal 104 drops to a low logic level as shown by the dark line at time $t_3$. Note that power supply voltage waveform 102 continues to increase to attain its normal operating voltage $V_{cc}$ at time $t_4$.

Thus, at time $t_4$ the power supply voltage has reached its normal operating voltage and will remain at that level until power is turned off from the circuit or some other type of a power loss occurs.

At voltages below $V_{write}$ the memory cells may still reliably hold data and the data may be read from the cells. However, at supply voltage values below $V_{write}$ the ability to write to the memory cells no longer exists. For this reason, prior power-on reset circuits will always attempt to assert the POR signal at some voltage slightly above $V_{write}$. This ensures that the integrated circuit will function properly or will be reset when memory cells have lost their write functionality for even a brief period of time. However, some circuits may be able to function reliably even when it is not possible to write to memory cells as long as the memory cells have not lost their data and the data may be read. As shown in FIG. 1, the voltage at which the memory cells will still reliably hold their data and can be read from is $V_{read}$, a voltage of about 0.8 Volts. Note that $V_{read}$ is substantially lower than $V_{write}$.

The present invention, therefore, does not reassert the POR signal at or before time $t_5$ when power supply voltage waveform 102 has dropped to $V_{write}$. Instead, the POR signal generated by the present invention is not reasserted until time $t_6$ when power supply voltage waveform 102 has dropped to $V_{POR2}$, equal to approximately 1.3 Volts. The $V_{POR2}$ voltage level is based on $V_{read}$ plus a safety margin. Thus, the present invention prevents resetting the controlled circuit until the power supply voltage has dropped an additional 1.4 Volts below $V_{POR1}$. Situations such as a "brown out" condition or other power anomaly may cause the power supply voltage to drop below the $V_{write}$ voltage level and then return to a normal $V_{cc}$ level. The present invention allows a circuit to function, and not reset itself, at voltages below $V_{write}$ and to only trigger a reset signal when absolutely necessary, that is, when the power supply voltage is so low as to potentially cause data loss in storage elements.

In FIG. 1, power supply voltage waveform 102 continues to decrease after time $t_6$ and the POR signal 104 continues to be asserted and track $V_{cc}$ as the power supply voltage is reduced. At time $t_7$ the power supply voltage is below $V_{read}$ so that the memory elements and the circuit no longer reliably hold their data. However, since the POR reset signal is being asserted the circuit is not functioning but is in a reset mode which ensures that no further errors can be propagated to the electronic system using the integrated circuit. After time $t_8$ the power supply voltage has fallen low enough so that the output of the POR circuit is undefined.

While not shown in FIG. 1, assuming, after time $t_6$ that $V_{cc}$ begins to rise again the behavior of POR signal 104 would be similar to that between times $t_1$ and $t_3$. That is, POR reset signal 104 would continue to be asserted until the power supply voltage reached the level $V_{POR1}$ at which time the POR reset signal 104 would be deasserted again.

Thus, the discussion of the timing diagram of FIG. 1 describes how the POR reset signal of the present invention is deasserted at a first power supply voltage level $V_{POR1}$ and is reasserted at a second voltage level $V_{POR2}$.

Figure 2:
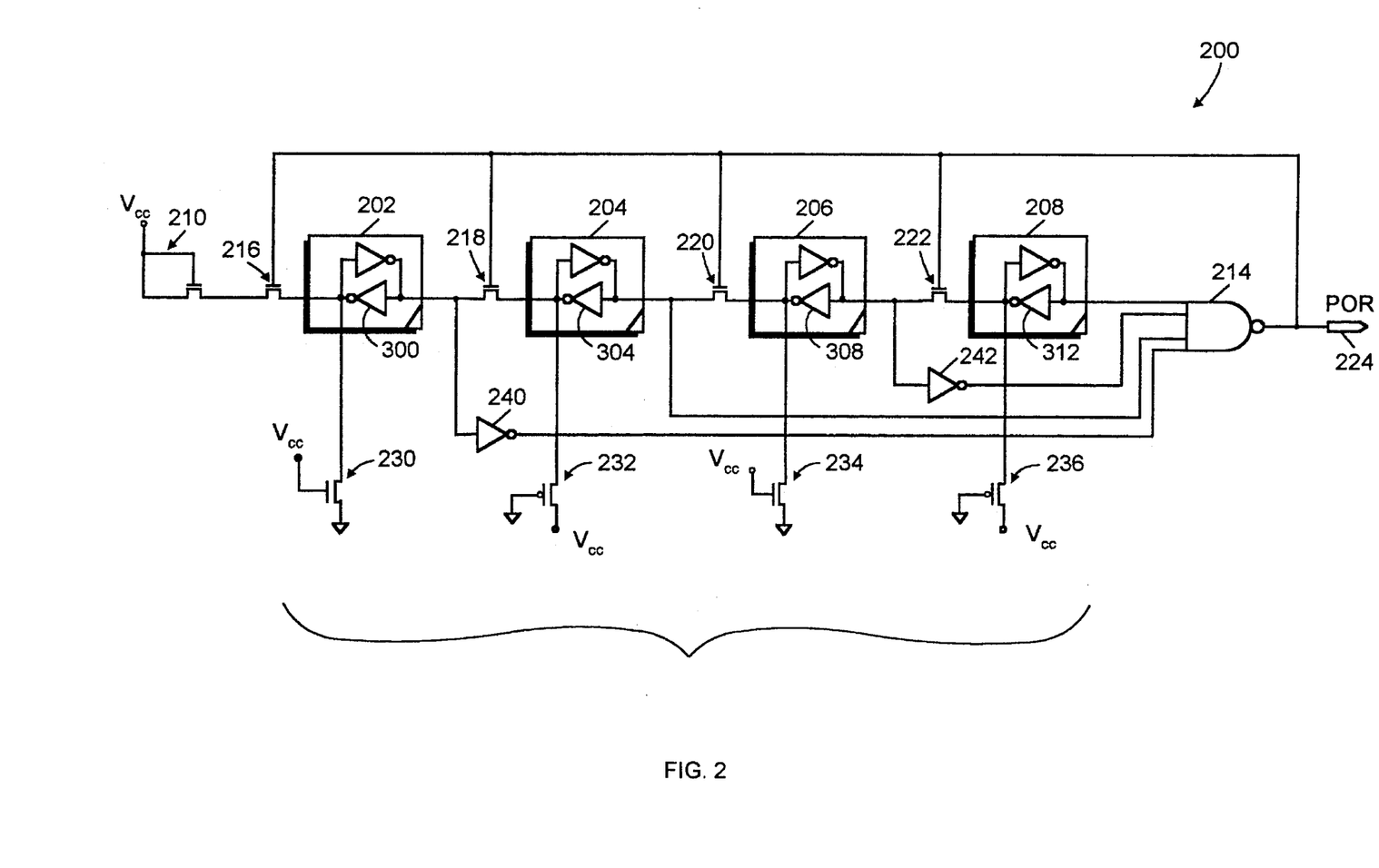
FIG. 2 shows a schematic diagram of a circuit for generating the reset signal of FIG. 1.

FIG. 2 shows a schematic diagram of a circuit for generating the POR reset signal 104 of FIG. 1.

FIG. 2 shows POR circuit 200 including SRAM cells 202, 204, 206 and 208. This circuit uses SRAM cells since the circuit being controlled by POR circuit 200 includes SRAM cells of the same type as the critical storage elements. In a preferred embodiment, SRAM cells 202–208 are fabricated on the same substrate with the same process technology as the SRAM cells in the circuit being controlled. In the preferred embodiment the SRAM cells and additional components in the POR circuit and circuit being controlled are fabricated with complimentary metal-oxide-semiconductor (CMOS) technology. Implementations of the present invention are possible in other process technologies, e.g., bipolar, or metal-oxide-semiconductor (MOS). An important aspect of the present invention is that storage elements such as SRAM cells 202–208 used in the POR circuit are formed identically with those storage elements used in the circuit being controlled so that the voltage levels for $V_{write}$ and $V_{read}$ of the POR circuit SRAM cell track those of the controlled circuit's SRAM cells.

When the power supply is first turned on the power supply voltage begins to climb from zero Volts to its normal operating Voltage of $V_{cc}$ (typically 3.3 volts or 5.0 Volts). When the power supply voltage is at a very low level below the gate turn on threshold of a transistor, approximately 0.7 Volts, the output of the POR circuit (as well as all circuits) is undefined. This corresponds to time before $t_1$ and after $t_8$ in FIG. 1. Once the power supply voltage is above the gate turn on threshold of a transistor the leaker transistor devices 230, 232, 234 and 236 bias the SRAM cells 202, 204, 206 and 208 into the following states: cell 202's and 206's input is low due to the pull down leaker transistors 230 and 234, cell 204's and 208's input is high due to the leaker pull ups 232 and 236. The output of the SRAM cells are the inversion of their input. Thus, the inputs to the NAND gate 214, coupled directly to SRAM cell outputs 204 and 208 and through inverters 240 and 242 to SRAM cell 202's and 206's outputs, are all at logic "0" and so the NAND gate's output is a logic "1". The NAND gate's output is the POR signal and thus the POR signal is asserted. The logic "1" and NAND gate 214's output tracks the power supply voltage level. Thus, the gate nodes of the transistors 216, 218, 220 and 222, which are tied to the NAND gate output, are at the power supply voltage. This allows these transistors to pass current between their source and drain nodes allowing them to act as pass gates. These pass gates have a finite "on" resistance which causes a voltage potential drop across their source and drain when passing a voltage signal.

In addition, for the pass transistor to maintain conduction, if the source (drain) is being driven high, the drain (source) will drop an additional $V_{TN}$ (the gate turn-on threshold of an N-channel transistor) below the gate voltage. These pass gates connect the SRAM cells 202, 204, 206, and 208 into a chain with the preceding SRAM cell's output driving the successive cell's input through a pass gate. Thus, SRAM cell 202's output drives SRAM cell 204's input through pass gate 218 and so on to end with SRAM cell 206's output driving SRAM cell 208's input through pass gate 222. The first SRAM cell, 202, has its input connected to the pull-up transistor 210, through pass gate 216. This pull-up contends with the pull-down paths of leaker transistor 230 and the low driving output of feedback inverter 300. As long as the power supply voltage does not rise high enough for transistor 210 to source enough current to pull the input of SRAM cell 202 high enough to be sensed as a logic "1" the state of each SRAM cell is consistent with the leaker transistors, and with the state of its neighboring SRAM cells, and the POR signal is asserted.

When the power supply voltage has risen sufficiently, transistor 210 and pass gate 216 will source enough current to pull the input of SRAM cell 202 high enough to be sensed as a logic "1". When this occurs, SRAM cell 202 changes state and its output will drive low. The output of 202 is now contending with the leaker pull up 232 and the high driving output of feedback inverter 304, through the transistor 218. SRAM cell 204 will not change state until the power supply voltage is high enough so that the low driving output of cell 202 and pass gate 218 are strong enough to drive SRAM cell 204's input low enough to be sensed as a logic "0". When this occurs, SRAM cell 204 is written with a logic "0." Note that similarly designed SRAM cells elsewhere in the circuit being controlled by the POR signal will also be operational with respect to their ability to write a logic "0" into neighboring SRAM cells. The additional pull up current of leaker transistors such as 232 within the POR circuit of FIG. 2, which are not present in SRAM cells outside the POR circuit, ensures that a slightly higher power supply voltage is needed for writing into SRAM cells within the POR circuit, such as SRAM cell 204, than is needed for SRAM cells in the controlled circuit. This provides a safety margin in that the POR signal will not be deasserted until the power supply voltage is sufficiently high enough so that SRAM cells in the controlled circuit are able to be written.

Since SRAM cell 204 is now written with a logic "0" at it's input it's output will drive high, contending with the leaker pull down 234 and the low driving output of feedback inverter 308, through transistor 220. When the supply voltage equals $V_{POR1}$, approximately 2.7 Volts, SRAM cell 204's output and pass gate 220 will be strong enough to drive SRAM cell 206's input high enough to be sensed as a logic "1". When this occurs, SRAM cell 206 is written with a logic "1." This ensures that similarly designed SRAM cells elsewhere in the controlled circuit are now operational with respect to writing a logic "1" into neighboring SRAM cells. The additional pull down current of leaker 234, which is not in SRAM cells outside the POR circuit, insures that the power supply voltage needed for writing a logic "1" into SRAM cell 206 is approximately 0.4 Volts higher than is needed in SRAM cells outside the POR circuit. The voltage needed to write a logic "1" into non POR SRAM cells equals $V_{write}$ and is approximately 2.3 Volts. Note that since in writing a logic "0" into an SRAM cell there is no $V_{TN}$ drop across the pass gate source and drain the writing of a "0" usually occurs at a lower voltage than the writing of a "1". This would be reversed if the pass gates were formed with P-channel transistors.

SRAM cell 206's output is now driving low. Since the power supply voltage is high enough to allow a "0" to be written into a POR SRAM cell, cell 208 senses its input as a logic "0" and changes state, driving a logic "1" at its output. As each of the SRAM cells change state each of the corresponding inputs to the NAND gate 214 change logic level. When SRAM cell 208 changes state, driving a logic "1" the last of the four inputs to NAND gate 214 changes to a logic "1". This causes the output of NAND gate 214 to change to a logic "0" deasserting the POR signal and allowing the controlled circuit or circuits outside the POR circuit to begin normal operation, while ensuring that the power supply voltage is high enough, with some safety margin, to allow SRAM cells to be reliably written. With the NAND gate output at zero Volts, the pass gates 216, 218, 220 and 222 are all turned off. This isolates the inputs and outputs of each of the four SRAM cells 202, 204, 206 and 208 from each other.

The SRAM cell 202, transistor 210 and pass gate 216 serve to initiate the changing of state of the SRAM cell chain. In addition, SRAM 202, if the leaker is neglected, provides the same input impedance to SRAM 204 as is seen by SRAM inputs of all other cells outside the POR circuit. This ensures that (again neglecting the leaker transistors which have negligible effect) SRAM cell 204 behaves identically to the SRAM cells outside the POR circuit. Similarly, SRAM cell 208 provides an output impedance for cell 206 that matches that seen by all other SRAM cells outside the POR circuit. The presence of the leaker transistors insures that $V_{POR1}$ is larger than $V_{write}$ and that $V_{POR2}$ is larger than $V_{read}$. SRAM 204 insures that a "0" can be reliably written and SRAM 206 insures that a "1" can be reliably written.

With the POR signal deasserted and pass gates 216, 218, 220 and 222 off, the SRAM cells remain in the same state they were in just prior to POR deasserting: SRAM 202 and 206 inputs are logic "1" SRAM 204 and 208 inputs are logic "0". The leaker devices are acting in opposition to these states of the SRAMs but they have very little current drive capability and the feedback inverter of the SRAM cells, 300, 304, 308 and 312, overdrive them as long as the power supply voltage is above $V_{POR2}$. If the power supply voltage now drops below $V_{POR1}$ the POR signal is not reasserted. The voltage needed to retain and read data from SRAM cell, both in the POR and outside the POR is much lower than that needed for writing into the SRAM. With the SRAM cells in the POR isolated, they will maintain their present state until the supply voltage drops low enough that the leaker transistors can overdrive the SRAM feedback transistors. This occurs at a power supply voltage equal to $V_{POR2}$, approximately 1.3 Volts. This voltage is approximately 1.4 Volts lower than required for writing into the POR SRAM, $V_{POR1}$, equal to about 2.7 Volts.

The presence of the leaker transistors insures that the power supply voltage at which the POR SRAM cells first loose their ability to retain their state and ability to be read, $V_{POR2}$, is higher than that of the SRAM cells outside the POR, $V_{read}$ equal to about 0.8 Volts. As soon as any one or more of the four SRAM cells in the POR changes state, one or more of the inputs to NAND gate 214 will change state to a logic "0". When this occurs, the NAND gate output changes to a logic "1" and the POR signal is reasserted. Once the POR signal is reasserted, the gate voltage of the pass gate transistors, 216, 218, 220 and 222 will be a logic "1" equal to the power supply voltage. This turns these pass gates on and once again the supply voltage must reach $V_{POR1}$ before the POR signal is deasserted.

Thus, it has been shown how the circuit of FIG. 2 generates a POR reset signal in accordance with POR reset signal 104 illustrated in the timing diagram of FIG. 1.

Figure 3:
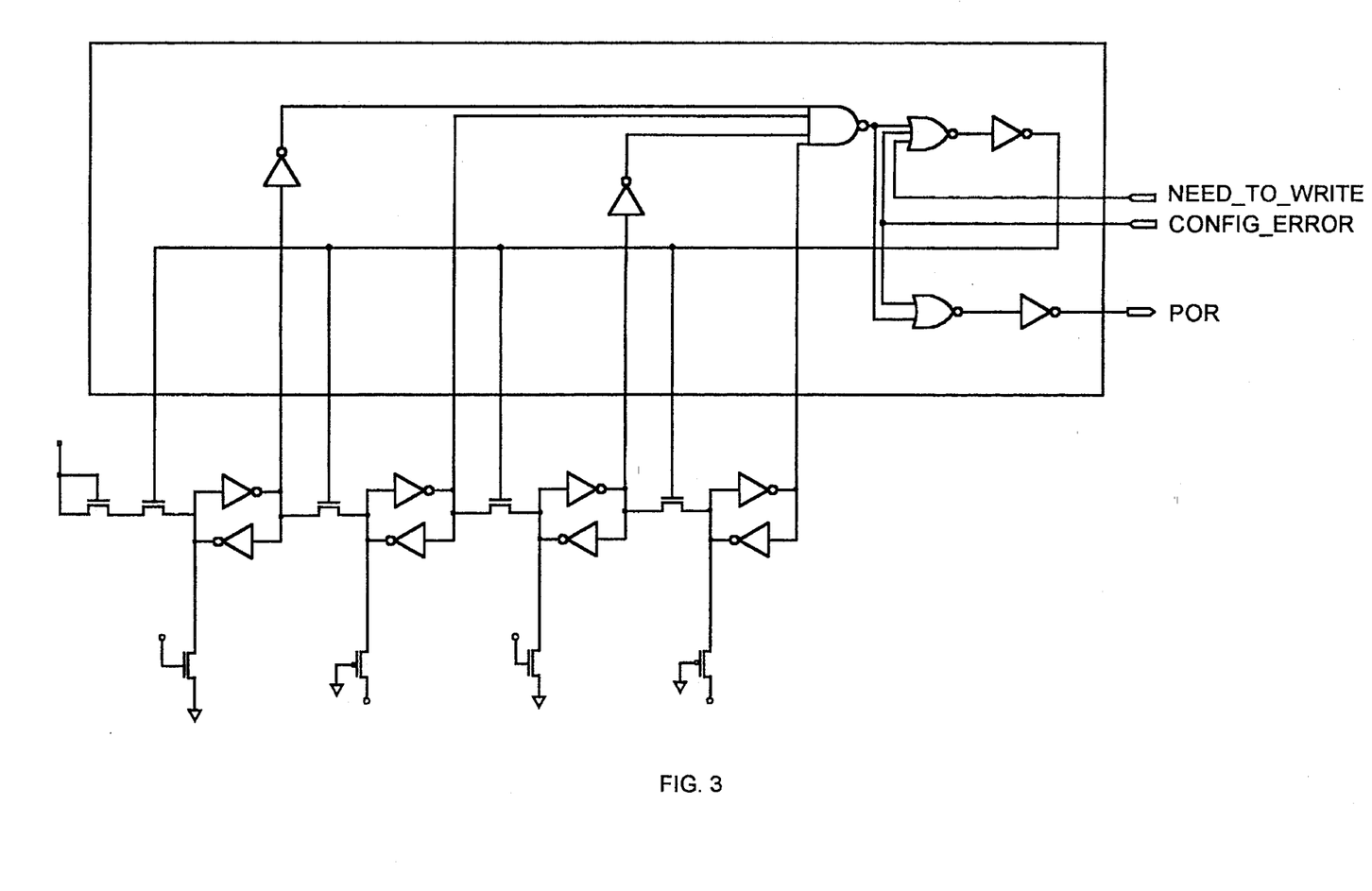
FIG. 3 shows a second circuit for generating the reset signal of FIG. 1.

FIG. 3 shows an important variation to the preferred embodiment that allows the controlled circuit to configure the POR circuit. In FIG. 3, the circuit of FIG. 2 is provided with control signals NEED$_{13}$TO$_{13}$WRITE and CONFIG$_{13}$ERROR. Control signal NEED$_{13}$TO$_{13}$WRITE is set by the controlled circuit to cause the POR circuit to assert the POR signal whenever the power supply voltage drops below $V_{POR1}$. In other words, control signal NEED$_{13}$TO$_{13}$WRITE allows the controlled circuit to request that the POR signal be asserted whenever the SRAMs in the controlled circuit are in danger of not being writable. Control signal CONFIG$_{13}$ERROR is used by the controlled circuit to force a POR reset by causing the POR signal to be asserted whenever the CONFIG$_{13}$ERROR signal is high.

As can be seen from FIG. 3, the circuit behaves identically to the circuit of FIG. 2 when both the NEED$_{13}$TO$_{13}$WRITE and CONFIG$_{13}$ERROR control signals are low. When the NEED$_{13}$TO$_{13}$WRITE control signal is high, the pass transistors are turned on. This causes the POR circuit to be sensitive to the write voltage level, $V_{write}$, as discussed above. With the NEED$_{13}$TO$_{13}$WRITE control signal high, the circuit will always assert the POR signal when the power supply voltage is below $V_{POR1}$ and will always deassert the POR signal when the power supply voltage is above $V_{POR1}$, similar to the prior art. This is different from the operation of the circuit of FIG. 2 where the POR signal is deasserted at $V_{POR1}$ after initial power-up and thereafter is sensitive to the $V_{POR2}$ voltage level.

The CONFIG$_{13}$ERROR signal is used to force the POR signal to go high. This is useful where the controlled circuit needs to initiate a power-on reset of itself. When CONFIG$_{13}$ERROR goes high, the pass transistors of the POR circuit are turned on so that the POR signal will remain asserted until the power supply voltage attains $V_{POR1}$. This is the same as the initial operation of the circuit of FIG. 2, discussed above. The operation of the circuit of FIG. 3 is essentially the same as the operation of the circuit of FIG. 2, discussed above, with the addition of the control signals to allow an external circuit (e.g., the controlled circuit) to configure or force the POR signal.

Figure 4:
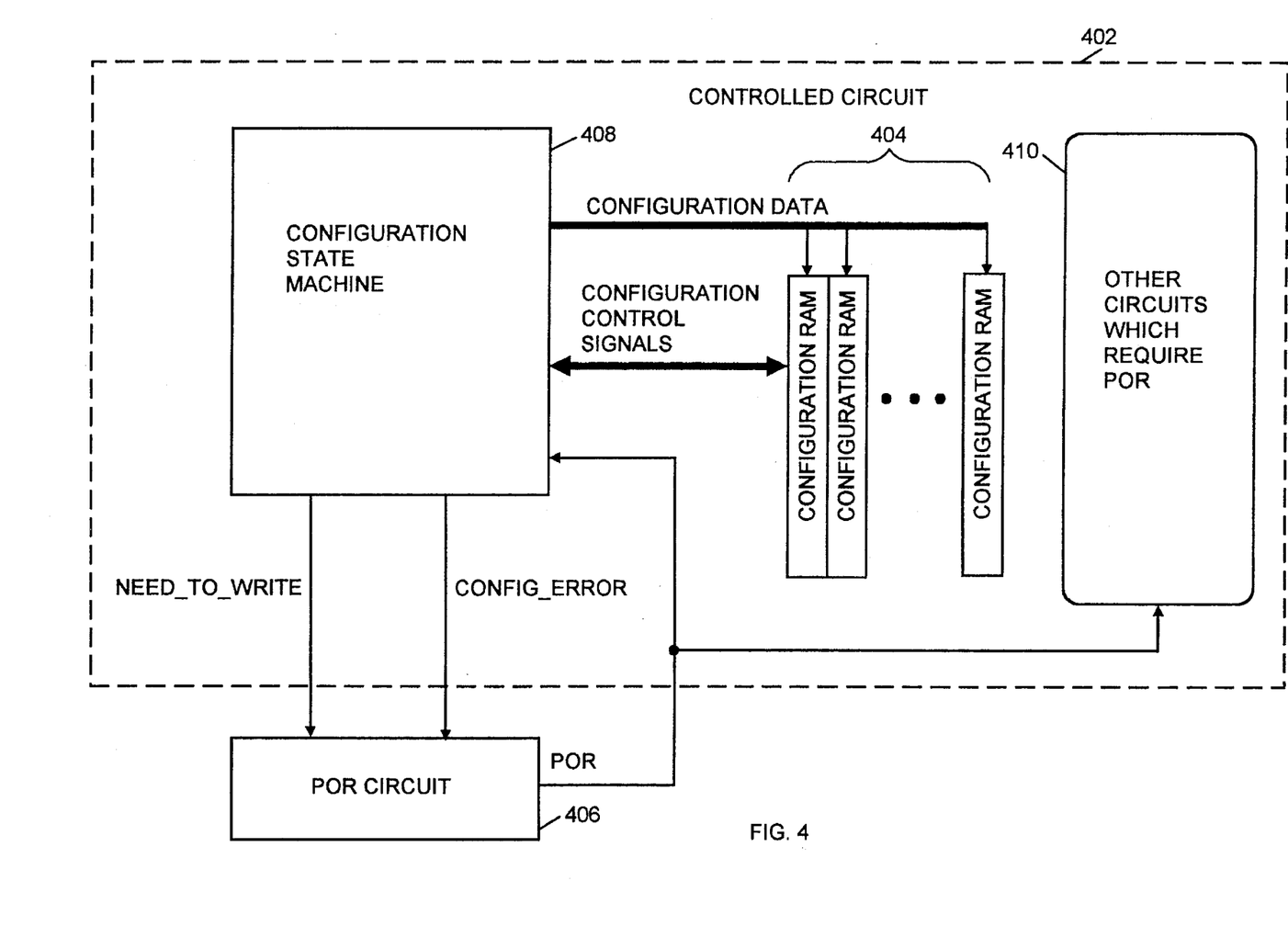
FIG. 4 shows a block diagram of a power-on reset circuit connected to a controlled circuit.

FIG. 4 shows a block diagram of the POR circuit connected to a controlled circuit including the control signals of FIG. 3. In FIG. 4, controlled circuit 402 includes RAM cells having electrical properties with respect to the power supply voltage that are as close as possible to the electrical properties of RAM (or, e.g., SRAM) cells used in POR circuit 406. Configuration state machine circuitry 408 communicates with RAM cells 404, receives the POR signal, and generates NEED$_{13}$TO$_{13}$WRITE and CONFIG$_{13}$ERROR control signals. The POR signal is also distributed to other circuitry, as needed, shown at block 410.

In operation, data is written to and read from RAM cells 404 by configuration state machine 408. Configuration state machine 408 is merely representative of any circuitry that communicates with storage elements such as RAM cells 404. Configuration state machine 408 generates control signals NEED$_{13}$TO$_{13}$WRITE and CONFIG$_{13}$ERROR to respectively configure the POR circuit to be sensitive to write voltage levels, only, or to force a reset of the circuit. The block diagram of FIG. 4 is but representative of one of many possible circuit arrangements that can be used with the POR circuit of the present invention.

Many other variations to the preferred embodiment are possible. As discussed, the POR circuit may be implemented in a variety of process technologies such as CMOS, bipolar, etc. Further, the specific voltage values of $V_{read}$, $V_{POR1}$, $V_{write}$, $V_{POR2}$ and $V_{cc}$, and other voltages in the circuits, may vary from those discussed herein. The safety margins may also be varied, as desired. Other modifications will be apparent.

In the foregoing specification, the invention has been described with reference to a specific exemplary embodiment thereof. It will, however, be evident that various modifications and changes may be made thereunto without departing from the broader spirit and scope of the invention as set forth in the appended claims. The specification and drawings are, accordingly, to be regarded in an illustrative rather than a restrictive sense, the invention being limited only by the provided claims.

What is claimed is:

1. A circuit for outputting a reset signal in response to a power supply voltage, the circuit comprising:

an output terminal for outputting the reset signal;

a first memory cell having an input and an output, wherein the first memory cell is coupled to the power supply voltage;

a second memory cell having an input and an output, wherein the output of the first memory cell is coupled to the input of said second memory cell;

a voltage supply coupled to the input of the first memory cell for placing the first memory cell in a first electrical state when the power supply voltage is at a first voltage level;

a pass gate coupled between the voltage supply and the input of the first memory cell for decoupling the voltage supply from the memory cells after the first memory cell has been placed in the first electrical state, said pass gate coupled to the input of said first memory cell;

leakage circuits coupled to the inputs of the memory cells;

combinational logic having inputs coupled to outputs of said first and second memory cells and an output coupled to the output terminal; and wherein the output terminal is coupled to the output of the combinational logic so that the reset signal is generated according to the electrical state of the memory cells.

2. The circuit of claim 1, further comprising:

third and fourth memory cells each having an input and an output, wherein the output of the second memory cell is coupled to the input of the third memory cell, wherein the output of the third memory cell is coupled to the input of the fourth memory cell, said combinational logic having inputs coupled to outputs of said third and fourth memory cells.

3. The circuit of claim 2, wherein the output of the combinational logic deasserts the reset signal when the outputs of the first, second, third and fourth memory cells are, respectively, low, high, low and high.

4. The circuit of claim 3, wherein the circuit is formed in an integrated circuit using CMOS technology.

5. The circuit of claim 4, herein the memory cells are SRAM.

6. A method of operating power-on reset circuit in an integrated circuit comprising the steps of:

asserting a power-on reset signal when power is supplied to said power-on reset circuit;

deasserting the power-on reset signal when a power supply voltage reaches a first voltage level;

again asserting said power-on reset signal when said power supply voltage reaches a second voltage level, said second voltage level being below said first voltage level wherein the step of asserting a power-on reset signal when said power is supplied to said power-on reset circuit comprises the step of:

coupling an input of a first memory element to a first voltage said first voltage setting an output of the first memory element to a first output level, said output of the first memory element coupled to and asserting said power-on reset signal coupling an input of a second memory element to a second voltage, said second voltage setting an output of the second memory element to a second output level, said output of the second memory element coupled to and asserting said power-on reset signal; and wherein said first and said second memory elements are coupled to the power supply voltage and are the same as memory elements elsewhere in said integrated circuit.

7. The method a recited in claim 6 wherein said first and said second memory element are SRAMs.

8. The circuit of claim 1 wherein said first and said second memory cells are the same type of memory cells as memory cells in a circuit controlled by said circuit for outputting a reset signal.

9. The circuit of claim 1 wherein said leakage circuits coupled to the inputs of said memory cells comprise transistors having a gate coupled to alternate ones of a power supply and ground, and a source or drain coupled to an alternate one of a power supply and ground.

* * * * *

UNITED STATES PATENT AND TRADEMARK OFFICE
CERTIFICATE OF CORRECTION

PATENT NO. : 5,612,642

DATED : Mar. 18, 1997

INVENTOR(S) : McClintock

It is certified that errors appear in the above-identified patent and that said Letters Patent is hereby corrected as shown below:

Col. 9, cl. 5: replace "herein" with --wherein--

Col. 9, cl. 6: after operating insert --a power-on--

Col. 10, cl. 7: replace "element" with --elements--

Signed and Sealed this

Seventeenth Day of June, 1997

Attest:

BRUCE LEHMAN

Attesting Officer

Commissioner of Patents and Trademarks